(12) United States Patent
Miyazawa et al.

(10) Patent No.: US 8,608,295 B2
(45) Date of Patent: Dec. 17, 2013

(54) PIEZOELECTRIC ELEMENT, LIQUID EJECTING HEAD, AND LIQUID EJECTING APPARATUS

(75) Inventors: Hiromu Miyazawa, Azumino (JP); Takayuki Yonemura, Suwa (JP); Koichi Morozumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/353,215

(22) Filed: Jan. 18, 2012

(65) Prior Publication Data

US 2012/0182359 A1 Jul. 19, 2012

(30) Foreign Application Priority Data

Jan. 19, 2011 (JP) .................. 2011-009281

(51) Int. Cl.
*B41J 2/045* (2006.01)
*C04B 35/495* (2006.01)
*H01L 41/18* (2006.01)
*H01L 41/187* (2006.01)
*C04B 35/00* (2006.01)

(52) U.S. Cl.
USPC .............. 347/68; 252/62.9 R; 252/62.9 PZ; 310/311

(58) Field of Classification Search
USPC .......... 347/68; 310/311; 252/62.9 R, 62.9 PZ
See application file for complete search history.

(56) References Cited

U.S. PATENT DOCUMENTS

| 7,586,234 B2 * | 9/2009 | Miyazawa et al. ............ 310/311 |
| 2005/0213020 A1 * | 9/2005 | Takeda et al. ................. 349/182 |
| 2010/0308692 A1 * | 12/2010 | Kobayashi et al. ........... 310/339 |
| 2011/0074249 A1 * | 3/2011 | Sakashita et al. ............ 310/339 |

FOREIGN PATENT DOCUMENTS

| JP | 2001-223404 | 8/2001 |
| JP | 2007204342 A * | 8/2007 |

* cited by examiner

Primary Examiner — Lisa M Solomon
(74) Attorney, Agent, or Firm — Workman Nydegger

(57) ABSTRACT

A piezoelectric element comprises a piezoelectric layer consisting a complex oxide having a perovskite structure containing bismuth and iron and electrodes provided to the piezoelectric layer. The complex oxide further contains a first dopant element that is magnesium and a second dopant element that is at least one of manganese, titanium, vanadium, niobium and tin.

4 Claims, 14 Drawing Sheets

BiFeO₃

BiFeO₃ + Bi_defect

FIG. 6  BiFeO₃+Bsite_Bi
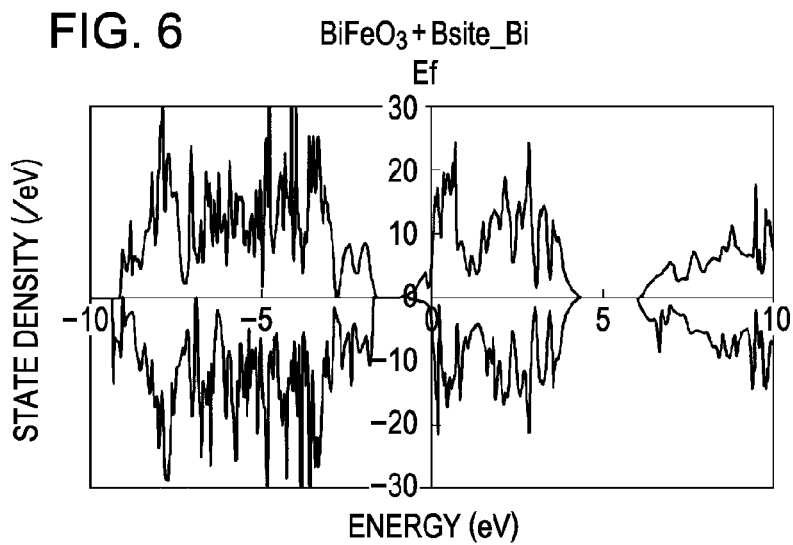
FIG. 7  PbZrTiO₃+Bsite_Pb
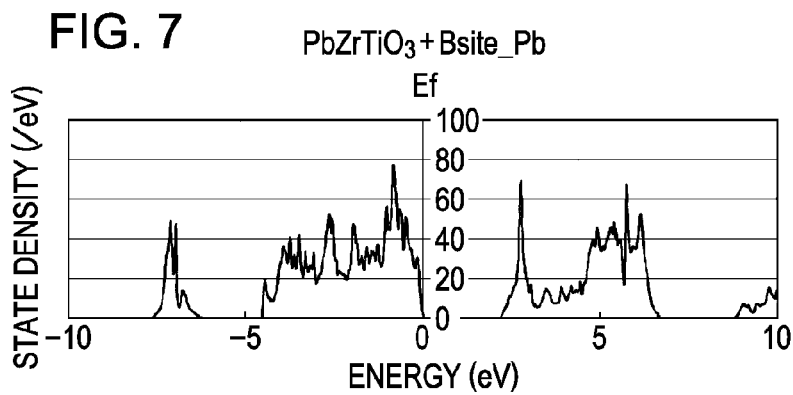
FIG. 8  BiFeO₃+O_defect
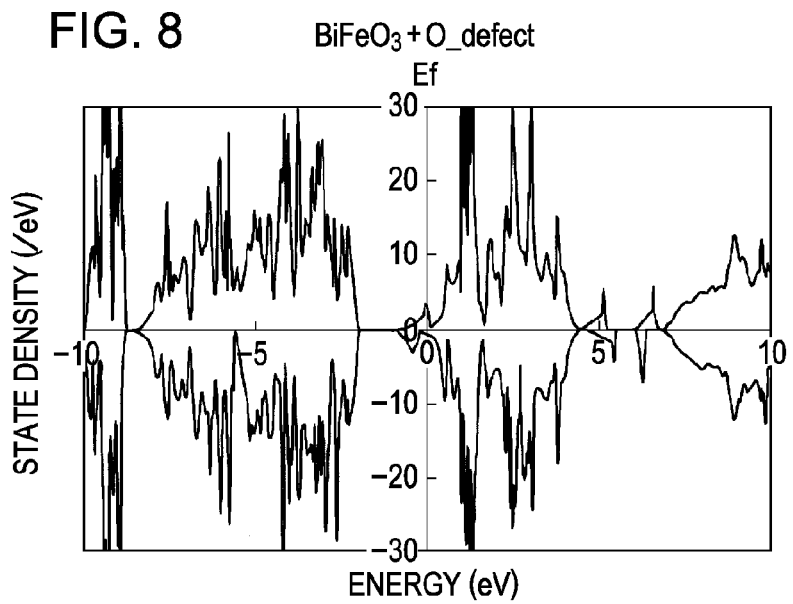

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-009281, filed Jan. 19, 2011 is expressly incorporated by reference.

BACKGROUND

1. Technical Field

The present invention relates to a liquid ejecting head that includes a piezoelectric element which has a piezoelectric layer and electrodes for applying a voltage to the piezoelectric layer so as to change the pressure in a pressure generating chamber communicating with a nozzle hole. The invention also relates to a liquid ejecting apparatus and a piezoelectric element.

2. Related Art

A piezoelectric element is used in a liquid ejecting head as a piezoelectric actuator in which two electrodes sandwich a piezoelectric layer formed of a piezoelectric material capable of converting electricity to mechanical work, for example a crystal dielectric material. A typical example of a liquid ejecting head is an ink jet recording head. In an ink jet recording head, a diaphragm constitutes part of a pressure generating chamber that communicates with a nozzle hole through which ink droplets are ejected, and the diaphragm is deformed by a piezoelectric element to pressurize an ink contained in the pressure generating chamber, thereby ejecting ink droplets from the nozzle hole.

Such piezoelectric materials that are used as piezoelectric layers (piezoelectric ceramics) in piezoelectric elements require high piezoelectric properties. As a typical example of one such piezoelectric material, JP-A-2001-223404 describes lead zirconate titanate (piezoelectric zirconate titanate (PZT)).

However, concerns for environmental issues have led to the need for piezoelectric materials containing less or no lead. An example of a lead-free piezoelectric material is $BiFeO_3$ which has a perovskite-type structure represented by $ABO_3$. The letters A and B in $ABO_3$ respectively indicate a 12-coordinate A site and a 6-coordinate B site occupied by oxygen atoms. However, $BiFeO_3$ piezoelectric materials have such low insulating properties that leakage current occurs easily. The high probability of leakage current increases the risk that cracks are caused, in particular when a high voltage is applied to the piezoelectric material. Thus, such piezoelectric materials are not suited for use in liquid ejecting heads. In order for a piezoelectric material to be used in a piezoelectric element, high insulating properties are required such that the leakage current is not more than $1 \times 10^{-3}$ $A/cm^2$ at 25 V, which is a typical drive voltage.

The problems described above are encountered not only with the ink jet recording heads but also with other liquid ejecting heads that eject liquid droplets other than ink droplets as well as with piezoelectric elements used in devices other than liquid ejecting heads. Further, the leakage current problem leads to another serious problem that the piezoelectric element consumes more energy when used as a sensor. Low leakage current is also preferable for piezoelectric elements used in piezoelectric sensors, infrared sensors, heat sensitive sensors and pyroelectric sensors that are operated at an applied voltage of 1 V or less.

SUMMARY

An advantage of some aspects of the invention is that liquid ejecting heads, liquid ejecting apparatuses and piezoelectric elements are provided which are environmentally friendly and have high insulating properties in order to suppress the occurrence of leakage current.

To solve the problems described above, an aspect of the invention is directed to a liquid ejecting head that includes a pressure generating chamber communicating with a nozzle hole, and a piezoelectric element which has a piezoelectric layer and electrodes provided with respect to the piezoelectric layer, the piezoelectric layer being formed of a Bi Fe perovskite-type composite oxide containing magnesium as a first dopant and at least one second dopant selected from the group consisting of manganese, titanium, vanadium, niobium and tin.

According to the above aspect, the piezoelectric element shows high insulating properties and suppresses leakage current with the result that the liquid ejecting head achieves excellent durability. Further, the liquid ejecting head contains no lead and is thus environmentally friendly.

In a preferred embodiment, the bismuth is contained in an A site, and the iron and the first and second dopants are contained in a B site.

In a preferred embodiment, the composite oxide has a defect in the A site of the perovskite-type structure, and has bismuth in the B site.

In a preferred embodiment, the composite oxide further contains barium titanate in addition to bismuth and iron. According to this preferred embodiment, the piezoelectric element of the liquid ejecting head shows higher piezoelectric properties (a larger amount of deformation).

Another aspect of the invention is directed to a liquid ejecting apparatus that includes the liquid ejecting head according to any of the aforementioned embodiments.

According to this aspect, the liquid ejecting apparatus has the piezoelectric element which shows excellent insulating properties and suppresses leakage current. Thus, the liquid ejecting apparatus achieves excellent durability. Further, the liquid ejecting apparatus is free of lead and is environmentally friendly.

Another aspect of the invention is directed to a piezoelectric element which has a piezoelectric layer and electrodes provided with respect to the piezoelectric layer, the piezoelectric layer being formed of a Bi Fe perovskite-type composite oxide containing magnesium as a first dopant and at least one second dopant selected from the group consisting of manganese, titanium, vanadium, niobium and tin.

According to this aspect, the piezoelectric element shows excellent insulating properties and suppresses leakage current. Further, the piezoelectric element is free of lead and is environmentally friendly.

BRIEF DESCRIPTION OF THE DRAWINGS

The invention will be described with reference to the accompanying drawings, wherein like numbers reference like elements.

FIG. 6 is a diagram that illustrates an electronic state density of $BiFeO_3$ in which 12.5% of Fe in the B site has been substituted by Bi.

FIG. 7 is a diagram that illustrates an electronic state density of $PbZrTiO_3$ in which 12.5% of the transition metal in the B site has been substituted by Pb.

FIG. 8 is a diagram that illustrates an electronic state density of $BiFeO_3$ in which 4% of the oxygen atoms in the oxygen site has been deleted.

DESCRIPTION OF EXEMPLARY EMBODIMENTS

Embodiment 1

Figure 1:
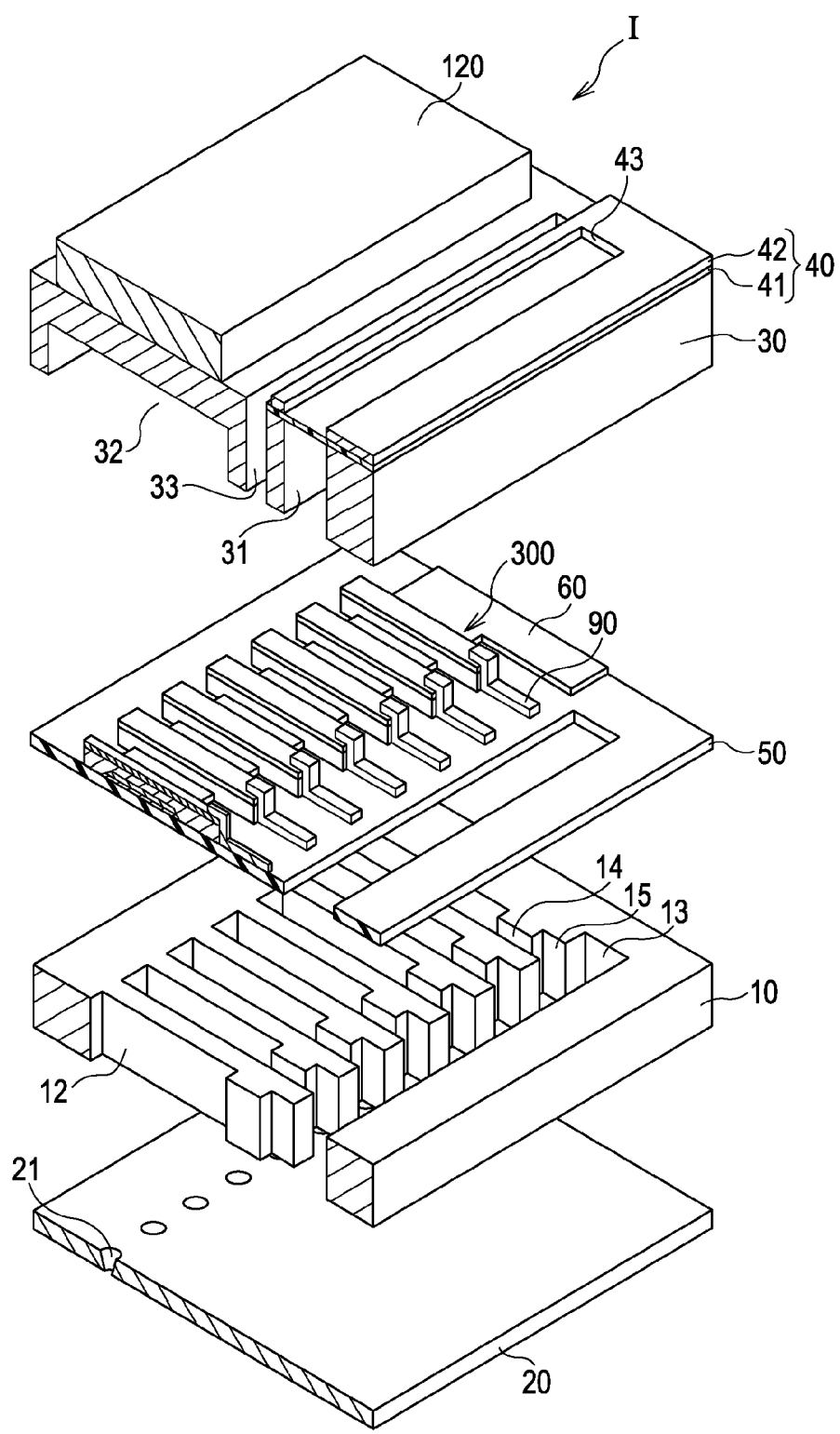
FIG. 1 is an exploded perspective view that illustrates a schematic structure of a recording head in accordance with Embodiment 1.
Figure 2:
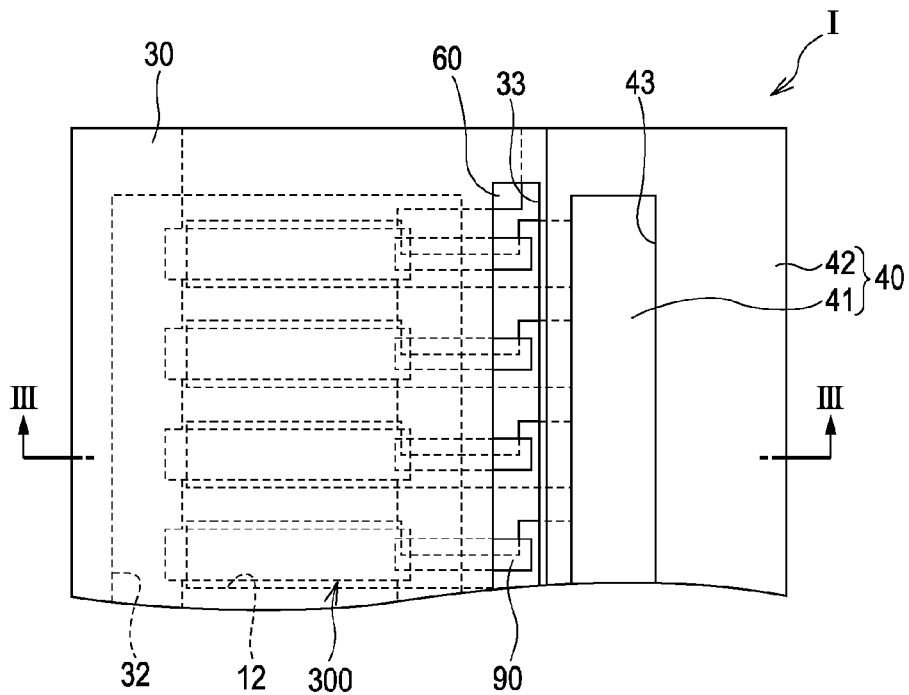
FIG. 2 is a plan view that illustrates a recording head in accordance with Embodiment 1.
Figure 3:
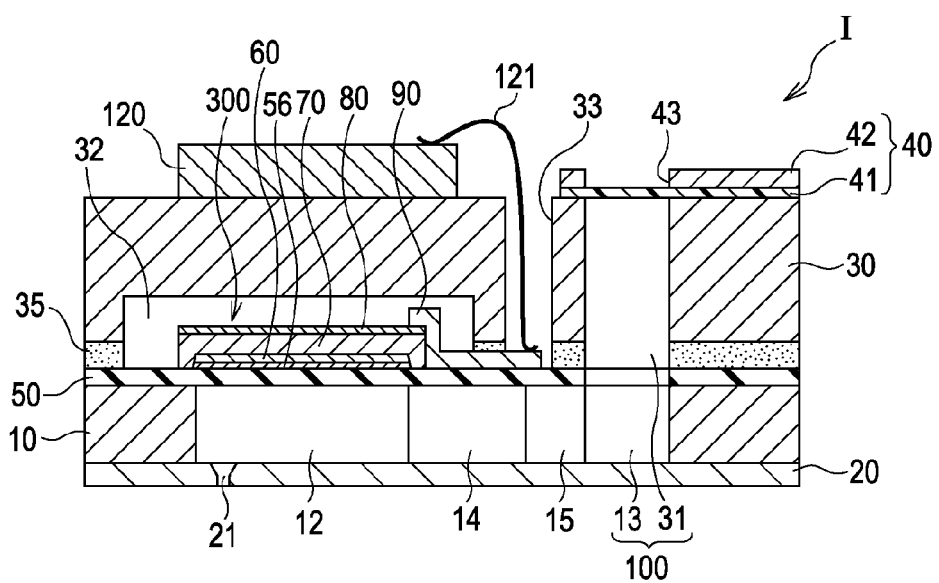
FIG. 3 is a sectional view that illustrates a recording head in accordance with Embodiment 1.

FIG. 1 is an exploded perspective view that illustrates a schematic structure of an ink jet recording head as an example of a liquid ejecting head in accordance with Embodiment 1. FIG. 2 is a plan view of FIG. 1. FIG. 3 is a sectional view along the line III-III in FIG. 2. As illustrated in FIGS. 1 to 3, a flow channel substrate 10 in this embodiment is a silicon single-crystal substrate. An elastic film 50 formed of silicon dioxide is provided on one surface of the flow channel substrate 10.

The flow channel substrate 10 defines a plurality of pressure generating chambers 12 that are arranged in the width direction of the flow channel substrate 10. Further, the flow channel substrate 10 defines a communication section 13 in a region that is outside of the pressure generating chambers 12 in the longitudinal direction. The communication section 13 communicates with each pressure generating chamber 12 via an ink supply path 14 and a communicating path 15 that are provided with respect to each pressure generating chamber 12. The communication section 13, in communication with a manifold section 31 of a protective substrate that will be described later, constitutes part of a manifold that is an ink reservoir common to the pressure generating chambers 12. The ink supply path 14 is formed with a smaller width than that of the pressure generating chamber 12, and thereby maintains the flow channel resistance of an ink that flows from the communication section 13 into the pressure generating chamber 12 constant. In this embodiment, the ink supply path 14 is formed by reducing the width of the flow channel from one side. Alternatively, the ink supply path 14 may be formed by reducing the width of the flow channel from both sides. Instead of reducing the width of the flow channel, the thickness or height of the flow channel may be reduced to form the ink supply path. In this embodiment, the flow channel substrate 10 defines a fluid flow channel including the pressure generating chambers 12, the communication section 13, the ink supply paths 14 and the communicating paths 15.

On the open side of the flow channel substrate 10, a nozzle plate 20 is bonded with, for example, an adhesive or a thermal fusion bonding film. In the nozzle plate 20, nozzle holes 21 have been perforated in the vicinity of the end opposite to the ink supply paths 14 of the pressure generating chambers 12 so as to be in communication with the pressure generating chambers 12. For example, the nozzle plate 20 is made of glass ceramic, silicon single-crystal or stainless steel.

On the side opposite to the open side of the flow channel substrate 10, the elastic film 50 is provided as described above. In order to increase the adhesion between the lower surface of a first electrode 60 and the elastic film 50 or a film provided on the elastic film 50, an adhesion layer 56 that is made of, for example, titanium oxide and that has a thickness of about 30 to 50 nm is provided on the elastic film 50. As required, an insulating film made of, for example, zirconium oxide may be provided on the elastic film 50.

On the adhesion layer 56, the first electrode 60, a piezoelectric layer 70 that is a thin film with a thickness of not more than 2 μm, preferably 0.3 to 1.5 μm, and a second electrode 80 are stacked on top of one another, thereby constituting a piezoelectric element 300. Here, the piezoelectric element 300 indicates a unit including the first electrode 60, the piezoelectric layer 70 and the second electrode 80. Typically, one of the electrodes of the piezoelectric element 300 is a common electrode, and the other electrode and the piezoelectric layer 70 are patterned with respect to each of the pressure generating chambers 12. In this embodiment, the first electrode 60 is a common electrode for the piezoelectric elements 300, and the second electrodes 80 are individual electrodes for the respective piezoelectric elements 300. This configuration may be reversed for convenience in terms of the arrangement of drive circuits or wires. Here, a combination of the piezoelectric element 300 and a diaphragm that can be bent or vibrated by driving of the piezoelectric element 300 will be referred to as an "actuator apparatus". In the configuration described above, the elastic film 50, the adhesion layer 56, the first electrode 60 and the optional insulating layer function as a diaphragm. However, this configuration is not restrictive. For example, the elastic film 50 or the adhesion layer 56 may be omitted, or the piezoelectric element 300 may be configured so as to substantially function as a diaphragm as well.

In the following description, a perovskite-type structure of a composite oxide containing transition metals will be described as $ABO_3$, in which the letters A and B respectively indicate a 12-coordinate A site and a 6-coordinate B site occupied by oxygen atoms.

In this embodiment, the piezoelectric layer 70 is formed of a composite oxide that has a perovskite-type structure containing bismuth (Bi) and iron (Fe). The composite oxide further contains magnesium as a first dopant and at least one second dopant selected from manganese, titanium, vanadium, niobium and tin. The piezoelectric layer having this configuration can suppress the occurrence of leakage current and achieves excellent insulating properties as will be described later. Further, this configuration reduces environmental load because the composite oxide does not contain lead.

An example of the composite oxide in this embodiment has a perovskite-type structure in which the A site contains bismuth and the B site contains iron. Each of the A site and the B site may contain other elements which substitute for bismuth and iron. Exemplary elements as substituents in the A site include lanthanum, praseodymium, neodymium, samarium and yttrium. Exemplary elements as substituents for the B site include cobalt, chromium, manganese, nickel and copper.

Bismuth contained in composite oxides such as $BiFeO_3$ is easily volatilized during production steps, in particular a step of calcining the piezoelectric layer, resulting in crystal defects in the A site. The bismuth that has been volatilized diffuses into the atmosphere in the production chamber and toward the electrode underneath the piezoelectric layer. As soon as bismuth is volatilized from the crystal system, oxygen is deleted in order to balance the number of electrons. The ratio between the bismuth defects and the oxygen defects is 2:3 to neutralize the electrical charge. The presence of oxygen vacancies produces a Coulomb potential which lowers the orbital energy of d electrons of the transition metal and reduces the bandgap of the piezoelectric element. This is the direct cause of leakage current. To prevent oxygen vacancies, the loss of bismuth should be suppressed. A possible remedy to this problem is to add bismuth in excess of the stoichiometric proportion. However, excess bismuth finds its way not only into the A site but also into the B site at a certain rate. The undesired bismuth that has been incorporated into the B site serves as a source of electron carriers, resulting in leakage current in the piezoelectric element. Thus, bismuth cannot be fed in excess of the stoichiometric proportion in the production of $BiFeO_3$ systems.

In the case of piezoelectric zirconate titanate ($PbZrTiO_3$: PZT), lead (Pb) is easily volatilized during production similarly to bismuth. A remedy has been thus adopted in which Pb is fed in excess of the stoichiometric proportion. Adding an excess amount of Pb results in unintended incorporation of Pb into the B site. However, as illustrated in FIG. 7 described later, PZT maintains a bandgap in the electron structure even with unintended incorporation of Pb in the B site. Thus, lead can be fed in excess of the stoichiometric proportion in the production of $PbZrTiO_3$ without deteriorating the insulating properties of the piezoelectric material.

The problems described above were further studied using first principle electronic state calculation, resulting in the following findings.

FIGS. 4 to 8 show electronic state densities of crystals determined using first principle electronic state calculation. The horizontal axis indicates the energy difference (eV) among electrons, and the vertical axis indicates the density of states (DOS) of electrons. The positive side relative to the zero density of states (/eV) indicates densities of up spin electrons, and the negative side indicates densities of down spin electrons. In carrying out the first principle electronic state calculation, use was made of an ultra soft pseudopotential method based on a density functional approach within generalized gradient approximation (GGA). For the transition metal atoms in the B site, a GGA plus U method was adopted to take into consideration the strong correlation effect due to the localization of d orbitals. The cutoff energy was 20 Hartree for wave function and 360 Hartree for charge density. The supercell of the crystal used in the calculation was made using $2\times2\times2=8$ $ABO_3$ perovskite-type structures. The reciprocal lattice point was ($4\times4\times4$) k point mesh.

Figure 4:
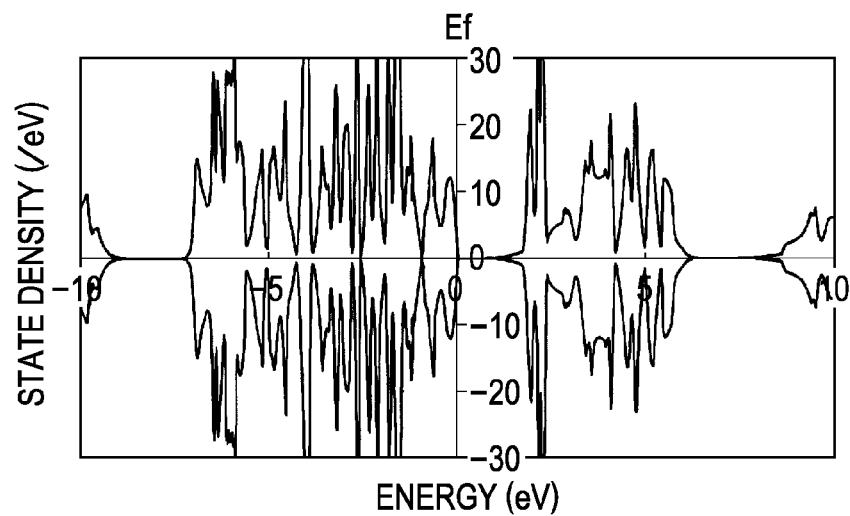
FIG. 4 is a diagram that illustrates an electronic state density of $BiFeO_3$ perfect crystal.
Figure 5:
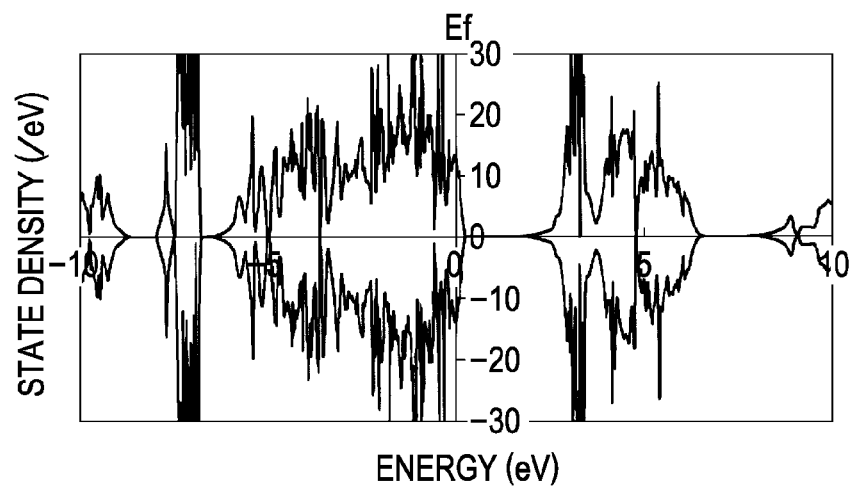
FIG. 5 is a diagram that illustrates an electronic state density of $BiFeO_3$ in which 12.5% of Bi in the A site has been deleted.

FIG. 4 is a diagram that illustrates an electronic state density of bismuth ferrite ($BiFeO_3$) perfect crystal. FIG. 5 is a diagram that illustrates an electronic state density of bismuth ferrite ($BiFeO_3$) in which 12.5% of Bi in the A site has been deleted. FIG. 6 is a diagram that illustrates an electronic state density of bismuth ferrite ($BiFeO_3$) in which the B site contains 12.5% of Bi. FIG. 7 is a diagram that illustrates an electronic state density of lead zirconate titanate ($PbZrTiO_3$) in which the B site contains 12.5% Pb. FIG. 8 is a diagram that illustrates an electronic state density of bismuth ferrite ($BiFeO_3$) in which the oxygen site has 4% oxygen vacancies.

The systems shown in FIGS. 4, 5, 6 and 8 were stable in the antiferromagnetic state.

In the case of a $BiFeO_3$ perfect crystal in which each of the sites did not have holes and Bi was not substituted by any other elements, as shown in FIG. 4, the highest occupied level (Ef) was at the top of the valence band and the bandgap was wide. That is, the crystal was an insulating crystal. In FIG. 4, the states that were lower in energy level than the bandgap formed the valence band, and the states that were higher in energy level formed the conduction band.

The highest occupied level refers to the highest energy level of the orbitals occupied by electrons in terms of one-electron energy obtained by electronic state simulation. In each of the electronic state density graphs, point 0 in the horizontal axis is set at the highest occupied level (Ef).

When part of bismuth (Bi) in the A site in $BiFeO_3$ is deleted to cause defects, as shown in FIG. 5, the empty state density appears on a more positive side than the 0 eV energy. That is, the highest occupied level shifts into the valence band energy region. Thus, the system was not an insulating system. That is, it was found that hole carriers had been formed and the system was a p-type system. The area of the empty state density indicates that the deletion of Bi from the A site gives three hole carriers.

When the B site contains bismuth (Bi), as shown in FIG. 6, the occupied state density appears on a more negative side than the 0 eV energy. That is, the highest occupied level shifts into the conduction band energy region. Thus, the system was not an insulating system. That is, it was found that electron carriers had been formed and the system was an n-type system. The area of the occupied state density indicates that the Bi in the B site gives two electron carriers. Accordingly, the use of an excess amount of Bi in the production process results in incorporation of electron carriers into the system and is not preferable in view of leakage characteristics.

FIG. 7 illustrates an electronic state density of PZT in which the B site contains 12.5% of Pb. As illustrated in FIG. 7, the PZT piezoelectric material can maintain a bandgap in the electron structure even if Pb has been unintentionally incorporated in the B site. Thus, lead can be fed in excess of the stoichiometric proportion in the production of $PbZrTiO_3$ without deteriorating the insulating properties of the piezoelectric material.

When the oxygen site of $BiFeO_3$ has 4% vacancies, as shown in FIG. 8, the occupied state density appears on a more negative side than the 0 eV energy. That is, the highest occupied level shifts into the conduction band energy region. Thus, the system was not an insulating system. That is, it was found that electron carriers had been formed and the system was an n-type system. The area of the occupied state density indicates that the vacancies in the oxygen site give two electron carriers.

As shown in FIGS. 5, 6 and 8, $BiFeO_3$ has both n-type defects and p-type defects. In the case of a semiconductor as an example, the electronic states of the carriers in the conduction band and the valance band are similar to free electrons. Therefore, hole carriers from p-type defects and electron carriers from n-type defects are spatially delocalized and can cancel each other out. On the other hand, the carriers in the conduction band and the valence band in a transition metal oxide are localized and have small mobility. Thus, the cancellation between the hole carriers and the electron carriers is not perfect. In a transition metal oxide, as a result, the carriers that have escaped the cancellation contribute to electrical conduction by hopping.

Figure 9:
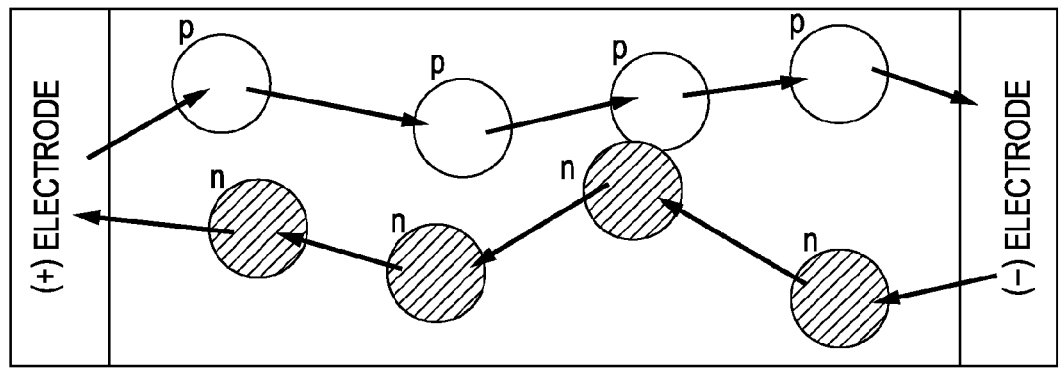
FIG. 9 is a schematic view that illustrates hopping conduction in crystal of a composite oxide.

FIG. 9 schematically illustrates hopping conduction in a transition metal compound having p-type defects and n-type defects. As illustrated, a transition metal compound has hopping conduction channels in each of the p-type defects and the n-type defects through which the hole carriers and the electron carriers can move. In such a case, even if the transition metal compound is doped so as to cancel one type of the carriers, hopping conduction by the other type of carriers cannot be suppressed. This is probably the reason why insulating properties of $BiFeO_3$ cannot be improved.

Thus, doping either of n-type dopant cancelling p-type defects or p-type dopant cancelling n-type defects cannot prevent the occurrence of leakage current. However, doping (co-doping) both n-type dopant and p-type dopant can prevent the occurrence of leakage current due to p-type defects and leakage current due to n-type defects.

This invention has been made based on this finding. That is, a composite oxide, for example a transition metal compound such as $BiFeO_3$, is doped (co-doped) with both n-type dopant and p-type dopant to prevent the occurrence of leakage current due to p-type defects and leakage current due to n-type defects, thereby achieving improvements in insulating properties.

Figure 10:
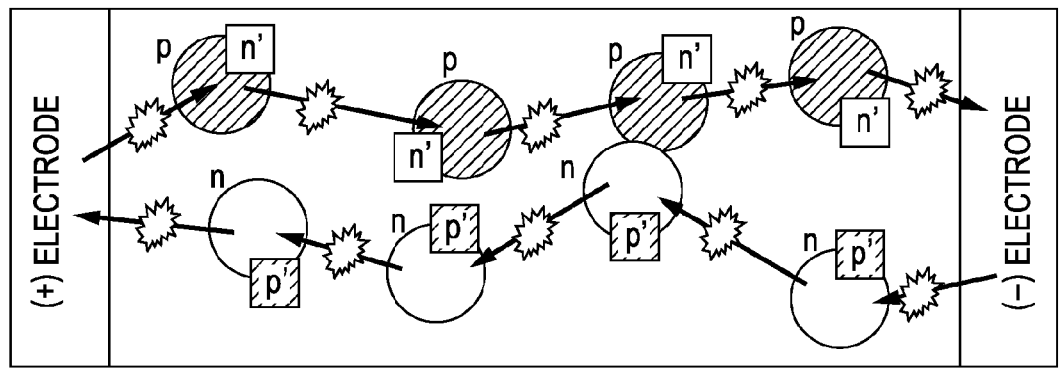
FIG. 10 is a schematic view that illustrates the prevention of hopping conduction in crystal of a composite oxide in accordance with the invention.

FIG. 10 schematically illustrates how hopping conduction is suppressed with the inventive transition metal compound that has been doped (co-doped) with both n-type dopant and p-type dopant. As illustrated, doping (co-doping) the composite oxide, for example the transition metal compound such as $BiFeO_3$, with both n-type dopant and p-type dopant results in p-type defects being cancelled by the n-type dopant and n-type defects being cancelled by the p-type dopant. As a result, the composite oxide can achieve a marked reduction in leakage current caused by hopping between p-type defects and leakage current caused by hopping between n-type defects.

In detail, the composite oxide, for example $BiFeO_3$, is doped with both magnesium (Mg) as a first dopant and at least one second dopant selected from manganese (Mn), titanium (Ti), vanadium (V), niobium (Nb) and tin (Sn).

The first dopant and the second dopant are substituted in the B site. The first dopant is a p-type donor which cancels n-type defects, and the second dopant is an n-type donor which cancels p-type defects.

FIGS. 11 to 16 show electronic state densities of the crystals in which 12.5% of Fe in the B site has been substituted by magnesium (Mg), manganese (Mn), titanium (Ti), vanadium (V), niobium (Nb) and tin (Sn), respectively, measured according to first principle electronic state calculation. The conditions for first principle electronic state calculation are as described above.

Figure 11:
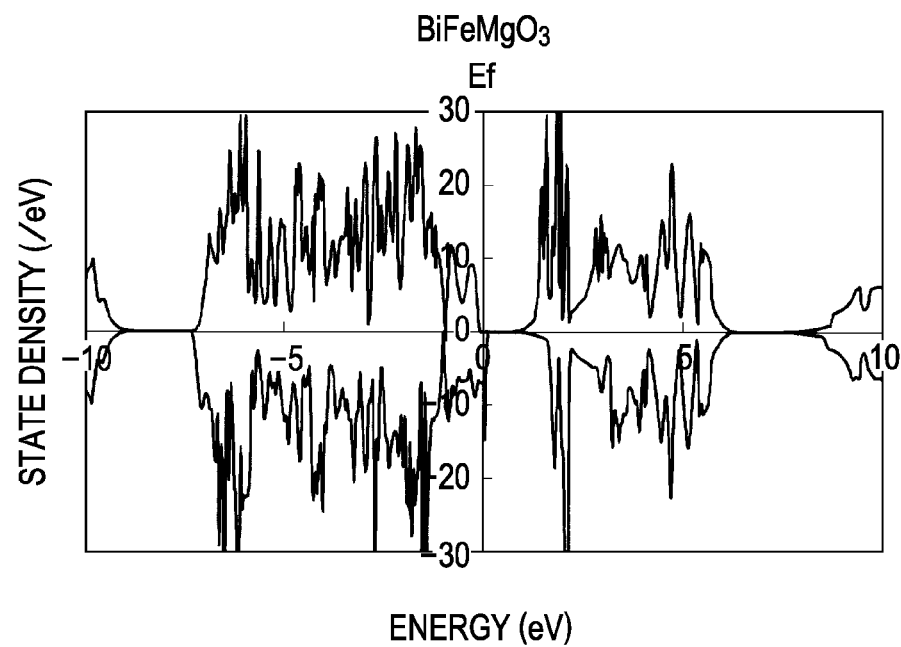
FIG. 11 is a diagram that illustrates an electronic state density of $BiFeO_3$ in which 12.5% of Fe in the B site has been substituted by Mg.
Figure 12:
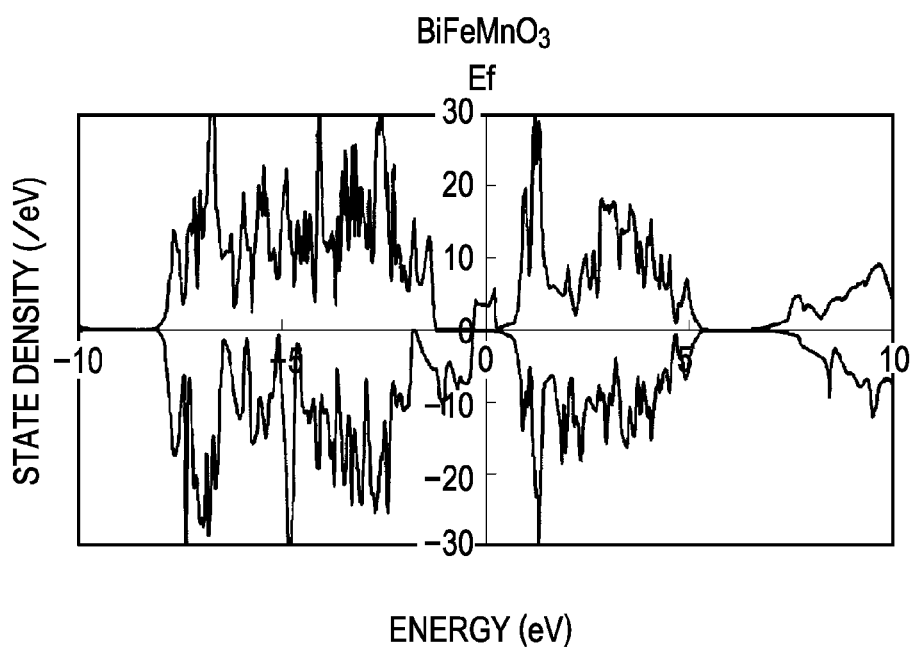
FIG. 12 is a diagram that illustrates an electronic state density of $BiFeO_3$ in which 12.5% of Fe in the B site has been substituted by Mn.
Figure 13:
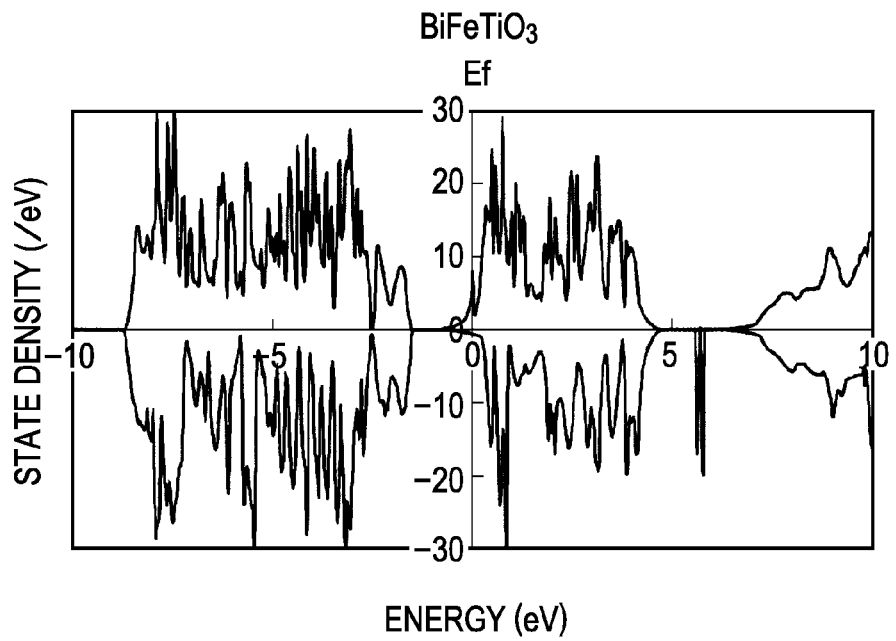
FIG. 13 is a diagram that illustrates an electronic state density of $BiFeO_3$ in which 12.5% of Fe in the B site has been substituted by Ti.
Figure 14:
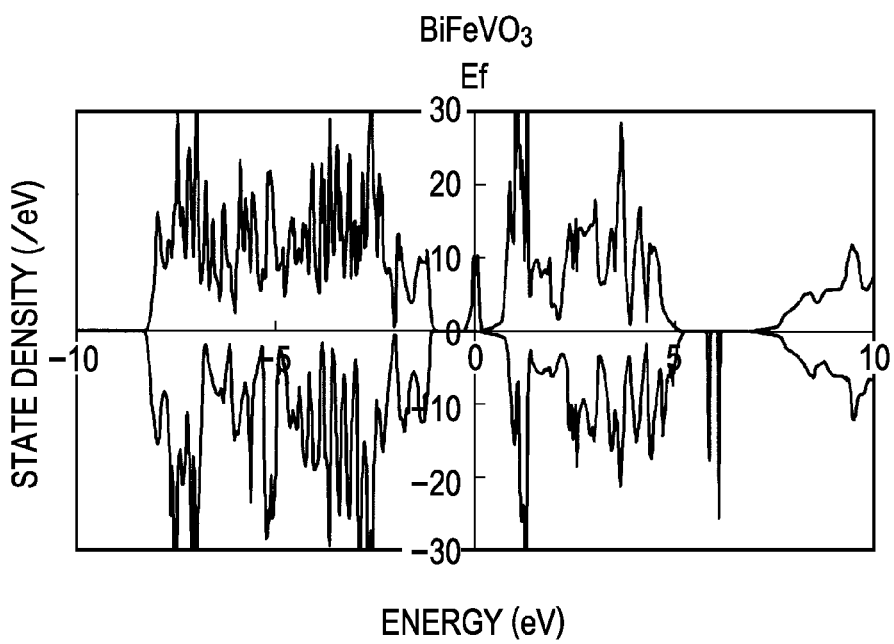
FIG. 14 is a diagram that illustrates an electronic state density of $BiFeO_3$ in which 12.5% of Fe in the B site has been substituted by V.
Figure 15:
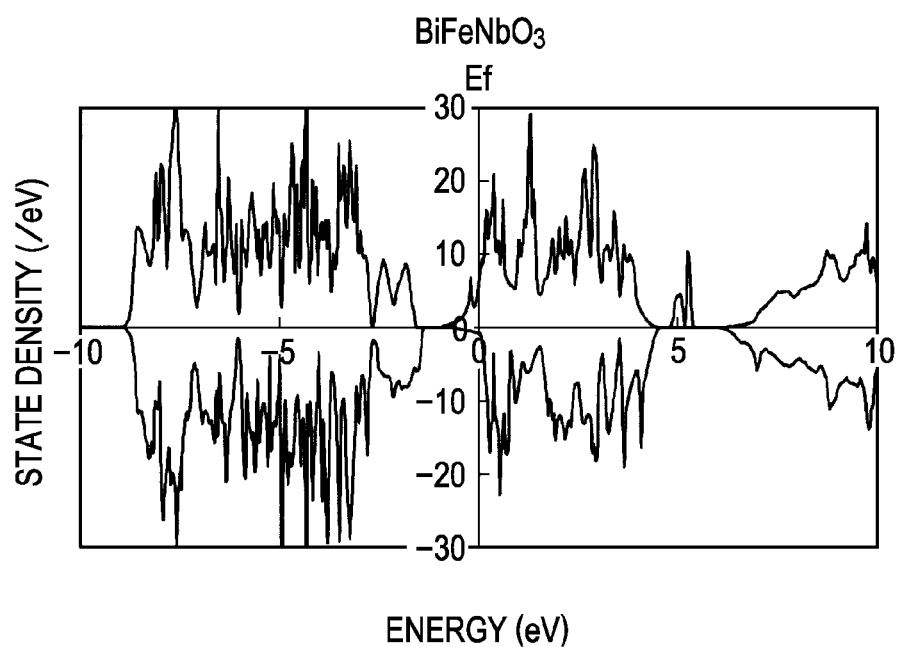
FIG. 15 is a diagram that illustrates an electronic state density of $BiFeO_3$ in which 12.5% of Fe in the B site has been substituted by Nb.
Figure 16:
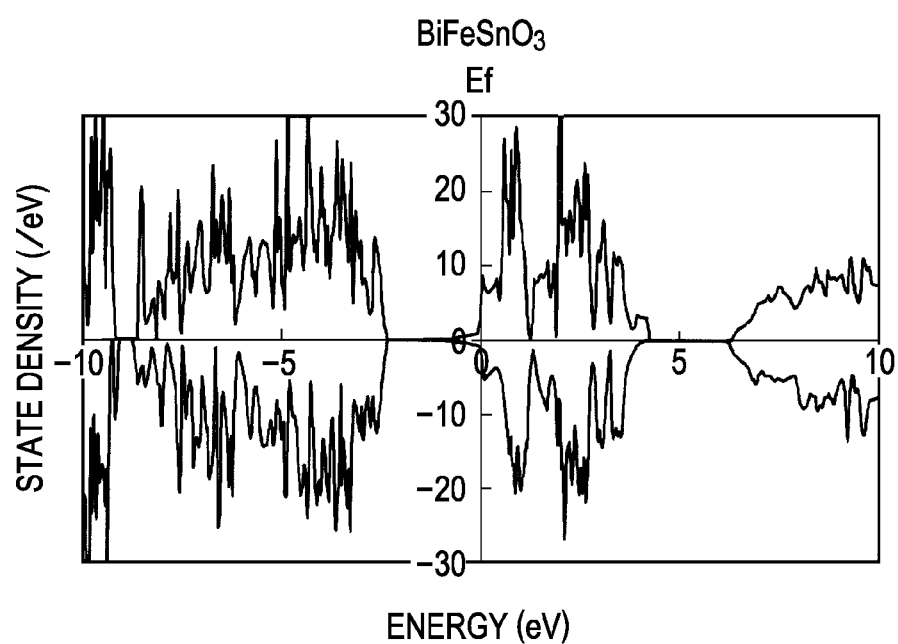
FIG. 16 is a diagram that illustrates an electronic state density of $BiFeO_3$ in which 12.5% of Fe in the B site has been substituted by Sn.

When part of iron (Fe) in $BiFeO_3$ is forcibly substituted by magnesium as the first dopant, as shown in FIG. 11, the empty state density appears on a more positive side than the 0 eV energy. That is, the highest occupied level shifts into the valence band energy region. Thus, the system was not an insulating system. That is, it was found that hole carriers had been formed and the doping type was a p-type. The area of the empty state density indicates that magnesium which has been substituted in the B site gives one hole carrier. It has been then found that magnesium (Mg) works as a p-type donor.

When part of iron (Fe) in $BiFeO_3$ is forcibly substituted by the second dopant that is any of manganese (Mn), titanium (Ti), vanadium (V), niobium (Nb) and tin (Sn), as shown in FIGS. 12 to 16, the occupied state density appears on a more negative side than the 0 eV energy. That is, the highest occupied level shifts into the conduction band energy region. Thus, the system was not an insulating system. That is, it was found that electron carriers had been formed and the doping type was an n-type. In the case of these dopants, Mn, Ti and Sn give one electron carrier, and V and Nb give two electron carriers. It has been then found that manganese (Mn), titanium (Ti), vanadium (V), niobium (Nb) and tin (Sn) work as n-type donors.

Because magnesium, which is the first dopant in the invention, gives one hole carrier to the system, the dopant can cancel one electron carrier generated from an n-type defect.

Because Mn, Ti and Sn, which are the second dopants in the invention, each give one electron carrier to the system, the dopants can cancel one hole carrier generated from a p-type defect. Further, because V and Nb, which are the second dopants in the invention, each give two electron carriers to the system, the dopants can cancel two hole carriers generated from p-type defects.

According to the invention, as described above, a transition metal compound such as $BiFeO_3$ is doped with the first dopant magnesium (Mg) to cancel out n-type defects, and at least one second dopant selected from manganese (Mn), titanium (Ti), vanadium (V), niobium (Nb) and tin (Sn) to cancel out p-type defects. Thus, the composite oxide of the invention can maintain high insulating properties.

The first and the second dopants substitute for the element in the B site such as Fe. The first dopant works so as to cancel out bismuth (n-type) in the B site, and the second dopant works so as to cancel out bismuth defects (p-type) in the A site.

The dosage of the first dopant magnesium (Mg) is preferably determined in accordance with the expected amount of n-type defects, and the dosage of the at least one second dopant selected from manganese (Mn), titanium (Ti), vanadium (V), niobium (Nb) and tin (Sn) is preferably determined in accordance with the expected amount of p-type defects. For example, an appropriate dosage will be not more than 10%, and preferably not more than 5%. The first dopant and the second dopant(s) may be introduced separately or simultaneously.

The dopants are distinguished from the elements that originally form the perovskite-type structure, and are introduced in amounts in accordance with the amounts of defects present in the crystal.

In the invention, the composite oxide may contain lanthanum having a large ionic radius in the A site. The presence of lanthanum suppresses the development of heterophases other than the perovskite-type structure. Because lanthanum has a much weaker covalent bond with the nearest oxygen than bismuth, the potential barrier for flipping the polarization moment by the application of an electric field is lowered. This circumstance that facilitates flipping of the polarization moment increases the piezoelectric properties. Because lanthanum is a metal having a valence of +3, the presence of this metal in the A site does not change the "balance of valences" in the invention, and no adverse effects causing leakage current are caused. The content of lanthanum in the A site is preferably 0.05 to 0.20 in terms of molar ratio relative to the total of bismuth and lanthanum. Praseodymium, neodymium and samarium have a large ionic radius with a valence of +3, and therefore have effects similar to those of lanthanum.

The composite oxide may contain cobalt (Co) and/or chromium (Cr) in addition to iron (Fe) in the B site. The content of these elements is preferably 0.125 to 0.875 in terms of molar ratio relative to the total of the elements in the B site. When the composite oxide contains cobalt and/or chromium in the B site at the specific ratio relative to iron, insulating properties and magnetic properties may be maintained. Because this composite oxide has a morphotoropic phase boundary (MPB), excellent piezoelectric properties are obtained. In particular, when the molar ratio of cobalt or chromium relative to the total of iron and cobalt or chromium is in the vicinity of 0.5, MPB provides, for example, an increased piezoelectric constant, resulting in particularly excellent piezoelectric properties.

Further, the composite oxide preferably contains, in addition to $BiFeO_3$, stoichiometric barium titanate (for example, perovskite $BaTiO_3$). In such a case, MPB is formed between rhombohedral $BiFeO_3$ and tetragonal $BaTiO_3$ at room temperature. An approximate compositional ratio for MPB to be formed is $BiFeO_3$:$BaTiO_3$=3:1. Accordingly, this ratio ensures that the piezoelectric layer 70 shows good piezoelectric properties such that the diaphragm can be greatly deformed at a low voltage. In the case where barium titanate is used in the production of the piezoelectric layer 70, the perovskite composite oxide formed between the barium titanate and the main component bismuth ferrite (for example, (Bi, Ba) (Fe, Ti)$O_3$) is doped with the first dopant and the second dopant simultaneously.

The piezoelectric layer 70 in this embodiment has a monoclinic crystal structure. That is, the piezoelectric layer 70 formed of the perovskite-type composite oxide has monoclinic symmetry. Such a piezoelectric layer 70 achieves high piezoelectric properties, probably because the structure permits easy flipping of the polarization moment of the piezoelectric layer upon application of an electric field in a direction perpendicular to the plane. In the piezoelectric layer, there is a direct relation between the amount of change in polarization moment and the amount of change in crystalline structure, and this relation determines piezoelectricity. For the reasons described above, the structure permitting easy change in polarization moment provides high piezoelectric properties.

The piezoelectric layer 70 preferably has an engineered domain configuration in which the polarization direction is inclined at a predetermined angle (50° to 60°) relative to the direction perpendicular to the layer plane (the thickness direction of the piezoelectric layer 70).

The crystalline orientation in the piezoelectric layer 70 may be any of (100) orientation, (111) orientation, (110) orientation and combinations of these orientations as long as the above polarization direction of the engineered domain is satisfied.

To each of the second electrodes 80 that are the individual electrodes for the piezoelectric elements 300, a lead electrode 90 is connected which extends from the vicinity of the end on the ink supply path 14 side so as to cover the elastic film 50 and an optionally-formed insulating layer. For example, the lead electrodes 90 are formed of gold (Au).

A protective substrate 30 is bonded through an adhesive 35 on the flow channel substrate 10 on which the piezoelectric elements 300 have been formed, namely, on or above the first electrode 60, the elastic film 50, an optionally-formed insulating layer and the lead electrodes 90. The protective substrate 30 has a manifold section 31 that constitutes at least part of a manifold 100. In this embodiment, the manifold section 31 is formed so as to penetrate the protective substrate 30 in the thickness direction and so as to extend in the width direction of the pressure generating chambers 12. As described hereinabove, the manifold section 31 communicates with the communication section 13 of the flow channel substrate 10 to constitute the manifold 100 that serves as an ink reservoir common to the pressure generating chambers 12. In another embodiment, the communication section 13 of the flow channel substrate 10 may be divided into a plurality of sections with respect to each of the pressure generating chambers 12. That is, the manifold may be formed of the manifold section 31 alone. Further, for example, the pressure generating chambers 12 alone may be formed in the flow channel substrate 10, and the ink supply paths 14 may be provided in a member (for example, the elastic film 50 or an optionally-formed insulating layer) that is interposed between the flow channel substrate 10 and the protective substrate 30 so as to communicate between the manifold 100 and each of the pressure generating chambers 12.

In a region of the protective substrate 30 that opposes the piezoelectric elements 300, a piezoelectric element holding section 32 is provided which has a space that does not hinder the movements of the piezoelectric elements 300. The space of the piezoelectric element holding section 32 may be sealed or open as long as it does not hinder the movements of the piezoelectric elements 300.

The protective substrate 30 is preferably formed of a material having a substantially identical coefficient of thermal expansion to that of the flow channel substrate 10. Exemplary such materials include glass materials and ceramic materials. In this embodiment, the protective substrate 30 is a silicon single-crystal substrate that is the same as that used for the flow channel substrate 10.

The protective substrate 30 has a through hole 33 that penetrates the protective substrate 30 in the thickness direction. The lead electrodes 90 that are connected to the piezoelectric elements 300 are provided such that end regions thereof are exposed in the through hole 33.

On the protective substrate 30, a drive circuit 120 is fixed which drives the piezoelectric elements 300 arranged adjacent to one another. The drive circuit 120 may be a circuit board or a semiconductor integrated circuit (IC) board. The drive circuit 120 and the lead electrodes 90 are electrically connected through connection wires 121 that are conductive wires such as bonding wires.

A compliance substrate 40 that is composed of a sealing film 41 and a fixing plate 42 is bonded on the protective substrate 30. The sealing film 41 is made of a plastic material having low rigidity. The sealing film 41 seals one side of the manifold section 31. The fixing plate 42 is made of a relatively hard material. The region of the fixing plate 42 that opposes the manifold 100 is an opening 43 in which the portion of the plate has been completely removed in the thickness direction. Accordingly, the one side of the manifold section 31 (the manifold 100) is sealed by the plastic sealing film 41 alone.

In the ink jet recording head I according to this embodiment, an ink is introduced from an ink inlet that is connected to an external ink supplier, which is not shown, thereby filling the inside ranging from the manifold 100 to the nozzle holes 21. Thereafter, in accordance with a recording signal transmitted from the drive circuit 120, a voltage is applied between the first electrode 60 and the second electrode 80 that correspond to the appropriate pressure generating chamber 12, thereby deforming the elastic film 50, the adhesion layer 56, the first electrode 60 and the piezoelectric layer 70. In this manner, the pressure in each of the pressure generating chambers 12 is increased to eject an ink droplet from the nozzle hole 21.

Next, there will be described an exemplary process for producing the ink jet recording head of the above embodiment with reference to FIGS. 17 to 21. FIGS. 17 to 21 are sectional views of the pressure generating chamber along the longitudinal direction.

Figure 17A:
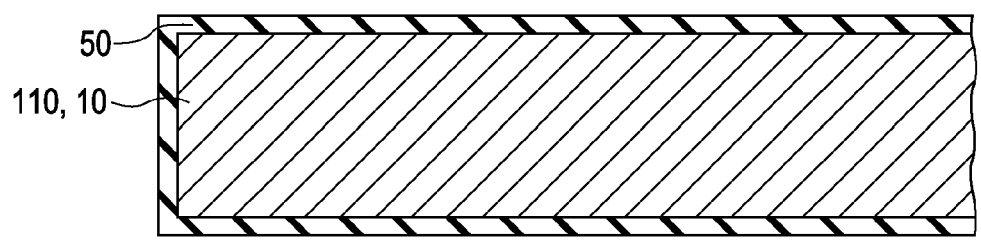
FIGS. 17A and 17B are sectional views that illustrate steps of producing a recording head in accordance with Embodiment 1.
Figure 17B:
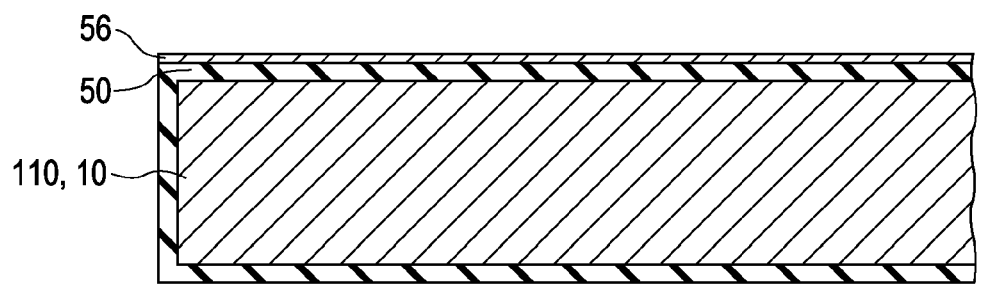

First, as illustrated in FIG. 17A, a silicon dioxide layer including silicon dioxide ($SiO_2$) that will form the elastic film 50 is formed by thermal oxidation or the like on the surface of a flow channel substrate wafer 110 that is a silicon wafer. Next, as illustrated in FIG. 17B, the adhesion layer 56 is formed by sputtering or thermal oxidation of titanium oxide or the like on the elastic film 50 (the silicon dioxide layer).

Figure 18A:
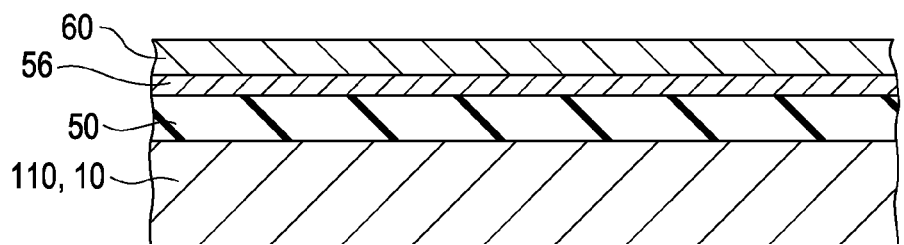
FIGS. 18A to 18C are sectional views that illustrate steps of producing a recording head in accordance with Embodiment 1.

Thereafter, as illustrated in FIG. 18A, a platinum layer that will form the first electrode 60 is formed by sputtering or the like on the entire surface of the adhesion layer 56.

Next, the piezoelectric layer 70 is stacked on the platinum layer. The piezoelectric layer 70 may be formed by MOD (a metal organic decomposition method) in which a solution containing metal complexes is applied and the resultant film is dried and calcined at a high temperature to give a piezoelectric layer formed of a metal oxide (the piezoelectric layer). Other chemical solution processes such as sol-gel processes, or gas phase processes such as sputtering may also be used. Alternatively, the piezoelectric layer 70 may be formed by methods such as laser ablation, sputtering, pulse laser deposition (PLD), CVD and aerosol deposition.

Figure 18B:
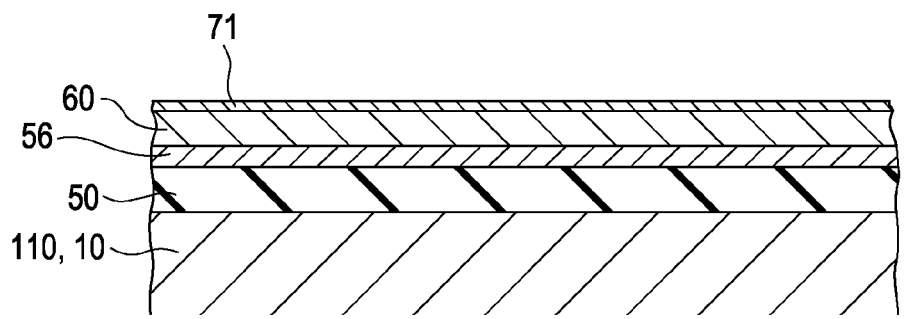

An example of the procedures for forming the piezoelectric layer 70 will be described. First, as illustrated in FIG. 18B, the first electrode 60 is coated with a sol or MOD solution (a precursor liquid) which contains metal complexes containing Bi, Fe, optionally La, Co and Cr, and the first dopant element and the second dopant element, in a ratio such that the target compositional ratio can be obtained. Here, the liquid may be applied by a method such as spin coating. In this manner, a piezoelectric precursor layer 71 is formed (application step).

The precursor liquid is a solution or a dispersion of a mixture which contains metal complexes capable of forming a composite oxide containing Bi, Fe, optionally La, Co and Cr, and the first dopant and the second dopant by calcination, in a ratio such that the molar ratios of the metals will be desired values. The solvent in the liquid may be an organic solvent such as alcohol.

Here, the term "metal complexes capable of forming a composite oxide containing Bi, Fe, optionally La, Co and Cr, and the first dopant and the second dopant by calcination" refers to a mixture of metal complexes which contain one or more metals selected from Bi, Fe, optionally La, Co and Cr, and the first dopant element and the second dopant element. Examples of the metal complexes containing any of Bi, Fe, optionally La, Co and Cr, and the first dopant element and the second dopant element include metal alkoxides, organic acid salts and β-diketone complexes.

An example of the metal complexes containing Bi is bismuth 2-ethylhexanoate. An example of the metal complexes containing Fe is iron 2-ethylhexanoate. An example of the metal complexes containing Co is cobalt 2-ethylhexanoate. An example of the metal complexes containing Cr is chromium 2-ethylhexanoate. An example of the metal complexes containing La is lanthanum 2-ethylhexanoate. An example of the metal complexes containing Mg is magnesium 2-ethylhexanoate. An example of the metal complexes containing Mn is manganese 2-ethylhexanoate. An example of the metal complexes containing Ti is titanium 2-ethylhexanoate. An example of the metal complexes containing V is vanadium 2-ethylhexanoate. An example of the metal complexes containing Nb is niobium 2-ethylhexanoate. An example of the metal complexes containing Sn is tin 2-ethylhexanoate. It is needless to mention that a metal complex containing two or more of these elements may be used.

Thereafter, the piezoelectric precursor layer 71 is heated to a predetermined temperature (150-400° C.) and dried for a predetermined time (drying step). Subsequently, the dried piezoelectric precursor layer 71 is heated to a predetermined temperature and degreased by being held at the temperature for a predetermined time (degreasing step). Here, degreasing means to remove organic components contained in the piezoelectric precursor layer 71 in the form of, for example, $NO_2$, $CO_2$ and $H_2O$. The drying step and the degreasing step may be performed in any atmosphere without limitation, for example in atmospheric air or inert gas.

Figure 18C:
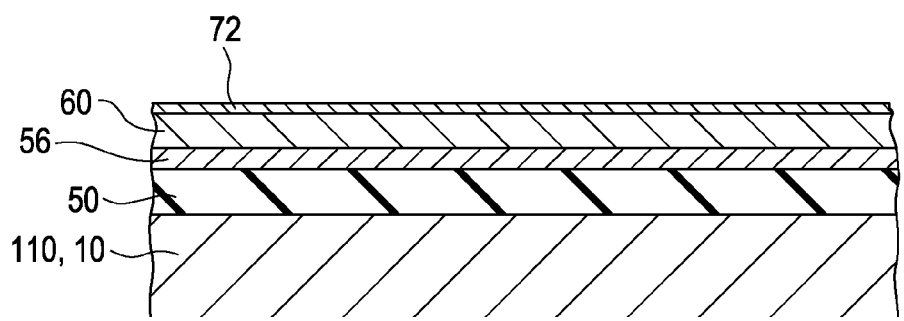

Next, as illustrated in FIG. 18C, the piezoelectric precursor layer 71 is crystallized by being heated to a predetermined temperature, for example about 600 to 800° C., and held at the temperature for a predetermined time, thereby forming a piezoelectric layer 72 (calcination step). The calcination step may be performed in any atmosphere without limitation, for example in atmospheric air or inert gas.

For example, the heating device used in the drying step, the degreasing step and the calcination step may be an RTA (rapid thermal annealing) device that heats an object by irradiation from an infrared lamp, or may be a hot plate.

Figure 19A:
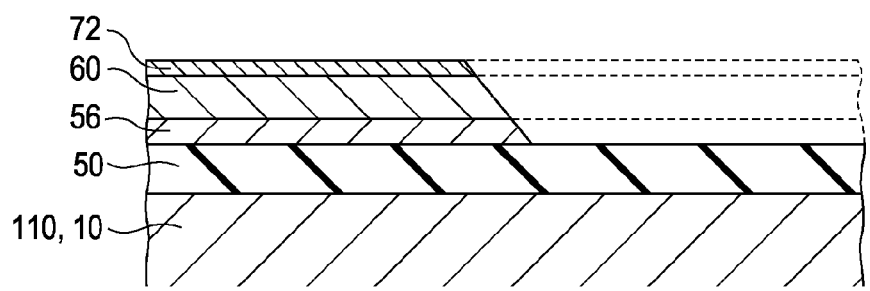
FIGS. 19A and 19B are sectional views that illustrate steps of producing a recording head in accordance with Embodiment 1.

Next, as illustrated in FIG. 19A, the first electrode 60 and the first piezoelectric layer 72 are patterned simultaneously through a predetermined resist (not shown) as a mask placed on the piezoelectric layer 72, in a manner such that the sides of these layers are inclined.

Figure 19B:
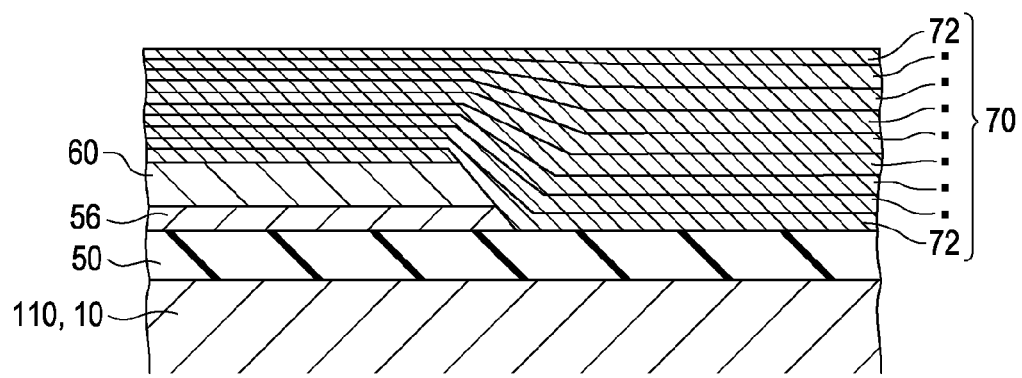

After the resist is separated, the application step, the drying step and the degreasing step, or the application step, the drying step, the degreasing step and the calcination step are repeated several times in accordance with the desired thickness or other desired parameter, thereby producing the piezoelectric layer 70 that is made up of a plurality of the piezoelectric layers 72. In this manner, the piezoelectric layer 70 is formed with the predetermined thickness which is made up of a plurality of the piezoelectric layers 72 as illustrated in FIG. 19B. In the case where a layer that is produced by one application of the precursor liquid is about 0.1 μm, the total thickness of the piezoelectric layer 70 made up of ten piezoelectric layers 72 will be about 1.1 μm. Although the piezoelectric layers 72 are stacked in this embodiment, the piezoelectric layer 70 may be formed of a single piezoelectric layer 72.

Figure 20A:
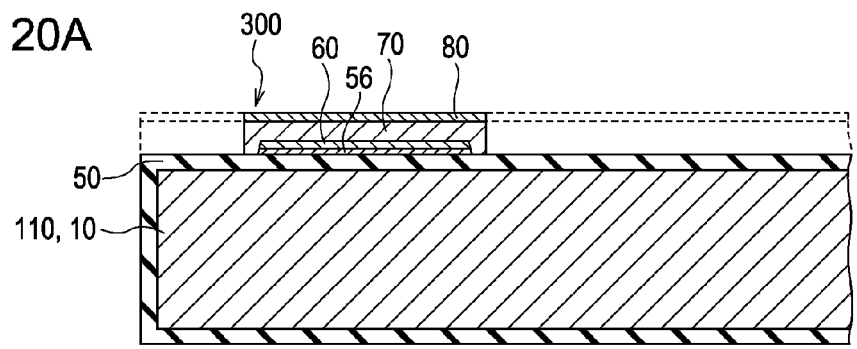
FIGS. 20A to 20C are sectional views that illustrate steps of producing a recording head in accordance with Embodiment 1.

After the piezoelectric layer 70 is formed, as illustrated in FIG. 20A, the second electrode 80 is formed by a method such as sputtering platinum or the like on the piezoelectric layer 70. The portions of the piezoelectric layer 70 and the second electrode 80 that oppose the respective pressure generating chambers 12 are patterned simultaneously, thereby producing the piezoelectric elements 300 constituted by the first electrode 60, the piezoelectric layer 70 and the second electrode 80. Here, the piezoelectric layer 70 and the second electrode 80 may be patterned simultaneously by dry etching through a resist (not shown) having the predetermined shape. Where necessary, the piezoelectric elements 300 may be post annealed at temperatures in the range of 600° C. to 800° C. The post annealing results in a favorable interface between the piezoelectric layer 70 and the first electrode 60 or the second electrode 80, and improves crystallinity of the piezoelectric layer 70.

Figure 20B:
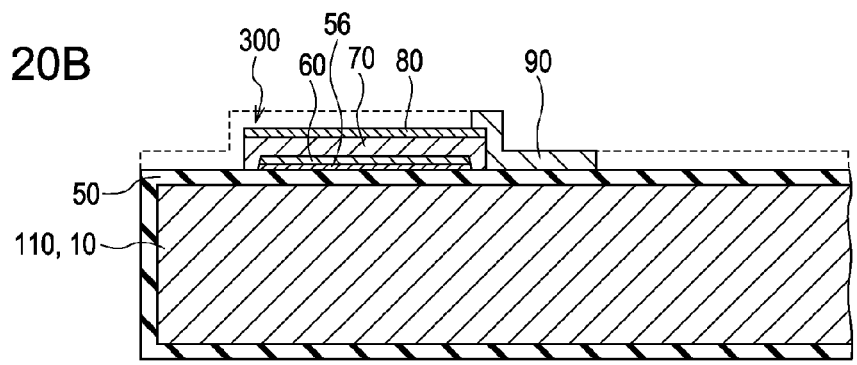

Next, as illustrated in FIG. 20B, the lead electrode 90 is formed using gold (Au) or the like over the entire surface of the flow channel substrate wafer 110, and is patterned with respect to each piezoelectric element 300 through a patterned mask (not shown) such as a resist.

Figure 20C:
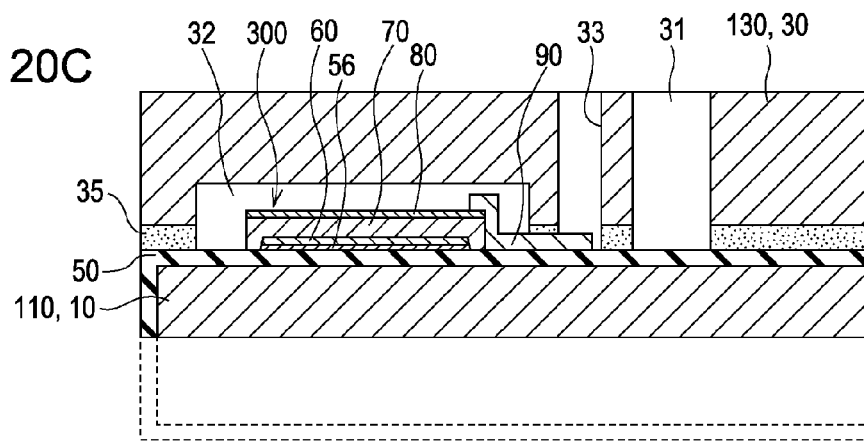

Next, as illustrated in FIG. 20C, a protective substrate wafer 130 that is a silicon wafer is bonded through an adhesive 35 onto the piezoelectric element 300 side of the flow channel substrate wafer 110. This protective substrate wafer 130 will give a plurality of protective substrates 30. Thereafter, the flow channel substrate wafer 110 is thinned to a predetermined thickness.

Figure 21A:
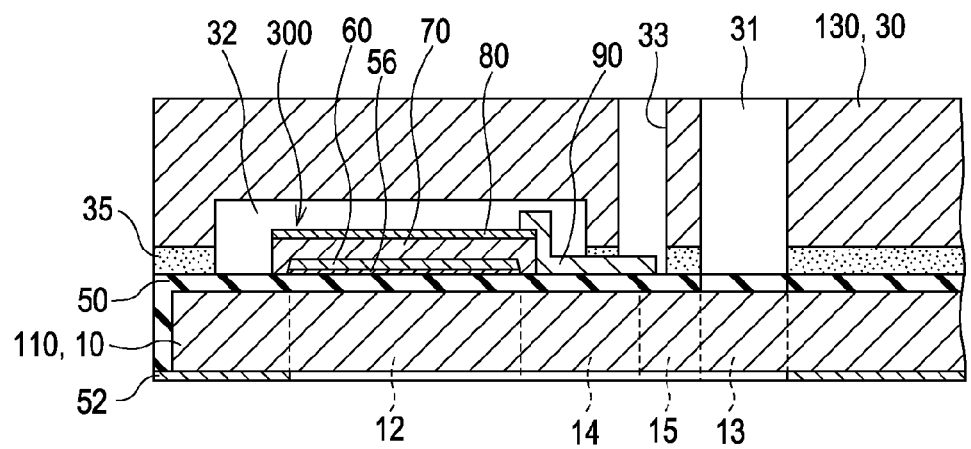
FIGS. 21A and 21B are sectional views that illustrate steps of producing a recording head in accordance with Embodiment 1.

Next, as illustrated in FIG. 21A, a mask layer 52 is newly formed on the flow channel substrate wafer 110 and is patterned to a predetermined shape.

Figure 21B:
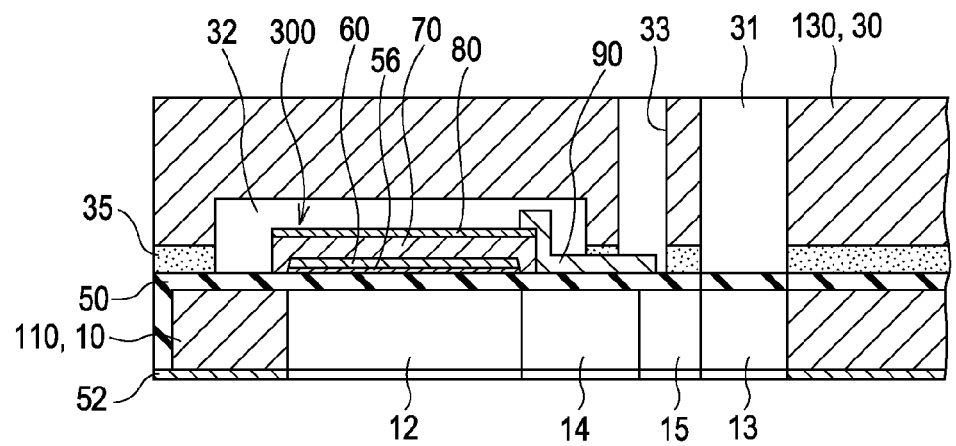

Thereafter, as illustrated in FIG. 21B, the flow channel substrate wafer 110 is anisotropically etched using an alkali solution such as KOH (wet etching) through the mask layer 52. Thus, constituents such as the pressure generating chambers 12, the communication section 13, the ink supply paths 14 and the communication paths 15 are formed with respect to the respective piezoelectric elements 300.

Thereafter, the undesired peripheral portions of the flow channel substrate wafer 110 and the protective substrate wafer 130 are cut and removed by dicing or the like. The mask layer 52 is then removed from the surface of the flow channel substrate wafer 110 that is opposite to the protective substrate wafer 130. Thereafter, the nozzle plate 20 having the nozzle holes 21 is bonded to the flow channel substrate wafer 110, and the compliance substrate 40 is bonded to the protective substrate wafer 130. The flow channel substrate wafer 110 and other members are divided into chip-sized flow channel substrates 10 including the other members as illustrated in FIG. 1. In this manner, the ink jet recording heads I according to the above-described embodiment may be manufactured.

Other Embodiments

The basic configurations of the invention are not limited to the embodiment described hereinabove. For example, although the flow channel substrate 10 in the above embodiment is a silicon single-crystal substrate, the substrate is not limited thereto and may be a differing material such as a SOI substrate or a glass substrate.

In the aforementioned embodiment, the piezoelectric element 300 is formed by sequentially stacking the first electrode 60, the piezoelectric layer 70 and the second electrode 80 on the substrate (the flow channel substrate 10). However, the configurations are not limited thereto, and the invention may be applied to a vertically vibrating piezoelectric element in which the piezoelectric material and the electrode-forming material are alternately stacked and are caused to vibrate in the axial direction.

Figure 22:
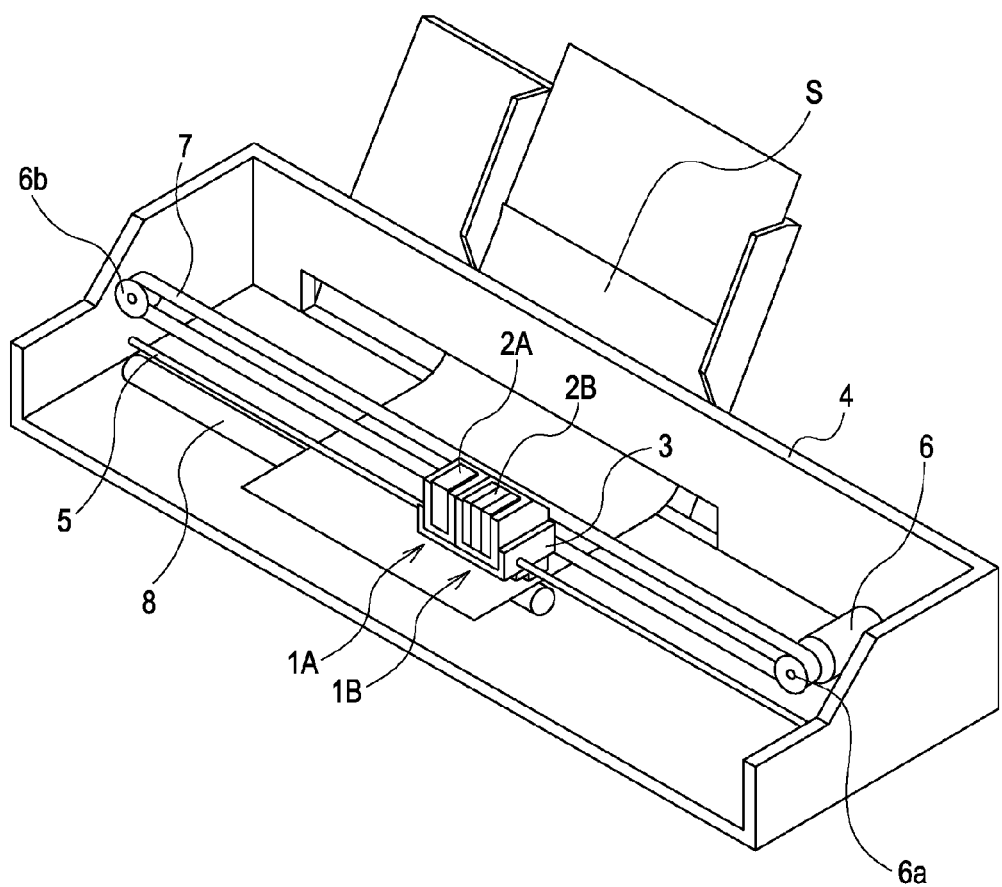
FIG. 22 is a view that illustrates a schematic structure of a recording apparatus in accordance with an embodiment of the invention.

The ink jet recording head in the above embodiment is incorporated into an ink jet recording apparatus by constituting part of a recording head unit which has ink flow channels communicating with ink cartridges and the like. FIG. 22 is a schematic view that illustrates an example of such an ink jet recording apparatus.

As illustrated in FIG. 22, cartridges 2A and 2B that are ink suppliers are detachably set in recording head units 1A and 1B each having the ink jet recording head I. The recording head units 1A and 1B are mounted on a carriage 3, which can freely move along a carriage shaft 5 fitted to an apparatus body 4. For example, the recording head units 1A and 1B are configured to eject a black ink composition and a color ink composition, respectively.

The driving force of a drive motor 6 is transmitted to the carriage 3 through a plurality of gear wheels, which are not shown, and a timing belt 7. In this manner, the carriage 3 carrying the recording head units 1A and 1B is moved along the carriage shaft 5. A platen 8 is fitted to the apparatus body 4 along the carriage shaft 5. A recording sheet S that is a recording medium such as paper is fed by a paper feed roller (not shown) or the like and is transported by being forwarded by the platen 8.

Although the embodiment shown in FIG. 22 describes the ink jet recording head units 1A and 1B as having the respective ink jet recording heads I, the scope of the invention is not limited to such a configuration. For example, the ink jet recording head units 1A or 1B may have two or more ink jet recording heads.

Although the above embodiment describes an ink jet recording head as an example of the liquid ejecting head, this invention is applicable to a wide range of liquid ejecting heads as well as to liquid ejecting heads that eject liquids other than inks. Examples of the liquid ejecting heads include various recording heads that are used in image recording apparatuses such as printers, colorant ejecting heads that are used in the production of color filters for liquid crystal displays and the like, electrode material ejecting heads that are used in the production of electrodes for organic EL displays, field emission displays (FED) and the like, and bioorganic material ejecting heads that are used in the production of biochips.

The piezoelectric elements of the invention have good insulating properties and piezoelectric properties to find use in liquid ejecting heads such as ink jet recording heads as described above. The applications of the piezoelectric elements are not limited thereto and include ultrasonic devices such as ultrasonic transmitters, ultrasonic motors, piezoelectric transducers, and various sensors such as infrared sensors, ultrasonic sensors, heat sensitive sensors, pressure sensors and pyroelectric sensors. Further, the invention may be applied to ferroelectric elements such as ferroelectric memories.

What is claimed is:
1. A piezoelectric element comprising:
a piezoelectric layer comprising a complex oxide having a perovskite structure with an A site and a B site; and
electrodes provided to the piezoelectric layer,
wherein the complex oxide further contains
a first dopant element that is magnesium, and
a second dopant element that is at least one of manganese, titanium, vanadium, niobium and tin;
wherein bismuth is contained in the A site, and iron and the first and second dopant are contained in the B site;

and wherein the complex oxide has a defect in the A site of the perovskite-type structure, and has bismuth in the B site.

2. The piezoelectric element according to claim 1, wherein the complex oxide further contains barium titanate in addition to bismuth and iron.

3. A liquid ejecting head that comprises the piezoelectric element described in claim 1.

4. A liquid ejecting apparatus that comprises the liquid ejecting head described in claim 3.

* * * * *